(12) United States Patent
Huang

(10) Patent No.: US 9,654,116 B1
(45) Date of Patent: May 16, 2017

(54) CLOCK GENERATOR USING RESISTIVE COMPONENTS TO GENERATE SUB-GATE DELAYS AND/OR USING COMMON-MODE VOLTAGE BASED FREQUENCY-LOCKED LOOP CIRCUIT FOR FREQUENCY OFFSET REDUCTION

(71) Applicant: MEDIATEK INC., Hsin-Chu (TW)

(72) Inventor: Yi-Chieh Huang, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/261,884

(22) Filed: Sep. 10, 2016

Related U.S. Application Data

(60) Provisional application No. 62/246,788, filed on Oct. 27, 2015.

(51) Int. Cl.
| | |
|---|---|
| *H03L 7/06* | (2006.01) |
| *H03L 7/083* | (2006.01) |
| *H03L 7/099* | (2006.01) |
| *H03K 3/03* | (2006.01) |

(52) U.S. Cl.
CPC ............ *H03L 7/083* (2013.01); *H03K 3/0315* (2013.01); *H03L 7/0995* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 5,382,921 A | 1/1995 | Estrada | |
| 5,920,220 A | 7/1999 | Takao | |
| 6,393,083 B1 | 5/2002 | Beukema | |
| 6,617,936 B2 | 9/2003 | Dally | |
| 7,760,833 B1 | 7/2010 | Brunner | |
| 8,710,929 B1 | 4/2014 | Naviasky | |

(Continued)

FOREIGN PATENT DOCUMENTS

| | | |
|---|---|---|
| EP | 2 312 753 A1 | 4/2011 |
| WO | 0016331 A1 | 3/2000 |

OTHER PUBLICATIONS

O'Mahony, A Programmable Phase Rotator based on Time-Modulated Injection-Locking, 2010 Symposium on VLSI Circuits/Technical Digest of Technical Papers, pp. 45-46.

(Continued)

*Primary Examiner* — Adam Houston
(74) *Attorney, Agent, or Firm* — Winston Hsu; Scott Margo

(57) ABSTRACT

A clock generator has a multi-phase controllable oscillator. The multi-phase controllable oscillator includes oscillator core circuits, and has phase nodes at which clock signals with different phases are generated, respectively. Each oscillator core circuit includes a resistive component and an inverter. The resistive component is coupled between a first phase node and a second phase node of the multi-phase controllable oscillator, wherein clock signals generated at the first phase node and the second phase node have adjacent phases. The resistive components of the oscillator core circuits are cascaded in a ring configuration. The inverter receives an input feedback clock signal from one phase node of the multi-phase controllable oscillator, and generates an output feedback clock signal to the second phase node according to the input feedback clock signal.

22 Claims, 10 Drawing Sheets

(56) References Cited

U.S. PATENT DOCUMENTS

| | | | |
|---|---|---|---|
| 2004/0158420 A1 | 8/2004 | Kim | |
| 2007/0277069 A1 | 11/2007 | Bonneau | |
| 2010/0039157 A1 | 2/2010 | Kaeriyama | |
| 2011/0241639 A1* | 10/2011 | Noda | H02M 3/156 323/282 |
| 2011/0241791 A1* | 10/2011 | Hung | H03B 5/36 331/158 |
| 2013/0195234 A1 | 8/2013 | Lee | |
| 2015/0188554 A1 | 7/2015 | Chong | |
| 2015/0349763 A1 | 12/2015 | Luo | |

OTHER PUBLICATIONS

Luo, Title of Invention: Method for Performing Phase Shift Control for Timing Recovery in an Electronic Device, and Associated Apparatus, U.S. Appl. No. 15/194,509, filed Jun. 27, 2016.

Masum Hossain et al, 7.4 Gb/s 6.8 mW Source Synchronous Receiver in 65 nm CMOS, IEEE Journal of Solid-State Circuits, vol. 46, No. 6, Jun. 2011, pp. 1337-1348, XP55313279.

Masum Hossain et al, A Fast-Lock, Jitter Filtering All-Digital DLL Based Burst-Mode Memory Interface, IEEE Journal of Solid-State Circuits, vol. 49, No. 4, Apr. 2014, pp. 1048-1062, XP011543999.

* cited by examiner

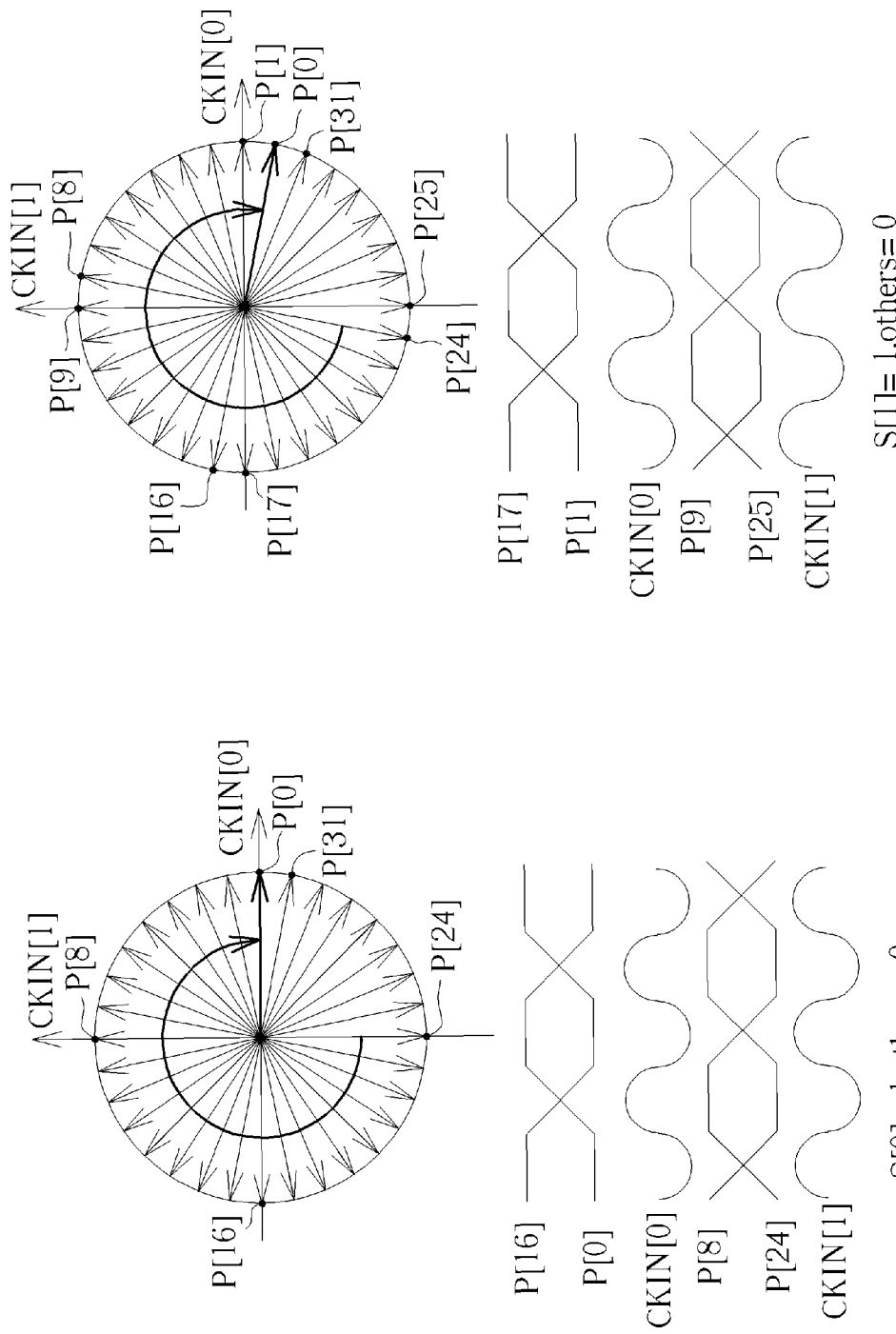

CLOCK GENERATOR USING RESISTIVE COMPONENTS TO GENERATE SUB-GATE DELAYS AND/OR USING COMMON-MODE VOLTAGE BASED FREQUENCY-LOCKED LOOP CIRCUIT FOR FREQUENCY OFFSET REDUCTION

CROSS REFERENCE TO RELATED APPLICATIONS

This application claims the benefit of U.S. provisional application No. 62/246,788, filed on Oct. 27, 2015 and incorporated herein by reference.

BACKGROUND

The present invention relates to generating clock signals with different phases, and more particularly, to a clock generator (e.g., an injection-locked phase rotator) using resistive components to generate sub-gate delays and/or using a common-mode voltage based frequency-locked loop circuit for frequency offset reduction.

Many electronic systems include one or more synchronous components that rely on receiving related signals at substantially the same time to maintain proper operating characteristics of the electronic system. In some cases, data transfer between system components may be synchronized by one or more clock signals originating from a common source. The system components may receive the clock signals through a clock network, which may include clock generation and distribution circuits. Hence, there is a need for a clock generator that is capable of generating the clock signals with fine phase steps for accurate timing control in various electronic applications.

SUMMARY

One of the objectives of the claimed invention is to provide a clock generator (e.g., an injection-locked phase rotator) using resistive components to generate sub-gate delays and/or using a common-mode voltage based frequency-locked loop circuit for frequency offset reduction.

According to a first aspect of the present invention, an exemplary clock generator is disclosed. The exemplary clock generator includes a multi-phase controllable oscillator. The multi-phase controllable oscillator has a plurality of phase nodes at which a plurality of clock signals with a plurality of different phases are generated, respectively, and comprises a plurality of oscillator core circuits. Each oscillator core circuit comprises a resistive component and an inverter. The resistive component is coupled between a first phase node and a second phase node of the multi-phase controllable oscillator, wherein clock signals generated at the first phase node and the second phase node have adjacent phases of the multi-phase controllable oscillator. The resistive components of the oscillator core circuits are cascaded in a ring configuration. The inverter is configured to receive an input feedback clock signal from one phase node of the multi-phase controllable oscillator, and generate an output feedback clock signal to the second phase node according to the input feedback clock signal.

According to a second aspect of the present invention, an exemplary clock generator is disclosed. The exemplary clock generator includes a multi-phase controllable oscillator, a clock injection circuit, and a frequency-locked loop (FLL) circuit. The multi-phase controllable oscillator has a plurality of phase nodes at which a plurality of clock signals with a plurality of different phases are generated, respectively. The clock injection circuit is configured to receive at least one reference clock signal and inject the at least one reference clock signal to the multi-phase controllable oscillator. The FLL circuit is configured to monitor a common-mode voltage at a common-mode voltage node of the clock injection circuit, and generate a frequency control signal to the multi-phase controllable oscillator to reduce a frequency offset between the at least one reference clock signal and the clock signals provided by the multi-phase controllable oscillator.

According to a third aspect of the present invention, an exemplary clock generation method is disclosed. The exemplary clock generation method comprises configuring a multi-phase controllable oscillator to have a plurality of oscillator core circuits, and utilizing the multi-phase controllable oscillator to provide a plurality of clock signals with a plurality of different phases at a plurality of phase nodes, respectively. Each oscillator core circuit comprises a resistive component and an inverter. The resistive component is coupled between a first phase node and a second phase node of the multi-phase controllable oscillator, wherein clock signals generated at the first phase node and the second phase node have adjacent phases of the multi-phase controllable oscillator. The resistive components of the oscillator core circuits are cascaded in a ring configuration. The inverter is configured to receive an input feedback clock signal from one phase node of the multi-phase controllable oscillator, and generate an output feedback clock signal to the second phase node according to the input feedback clock signal.

According to a fourth aspect of the present invention, an exemplary clock generation method is disclosed. The exemplary clock generation method comprises utilizing a multi-phase controllable oscillator to provide a plurality of clock signals with a plurality of different phases at a plurality of phase nodes, respectively; utilizing a clock injection circuit for receiving at least one reference clock signal, and injecting the at least one reference clock signal to the multi-phase controllable oscillator; and monitoring a common-mode voltage at a common-mode voltage node of the clock injection circuit, and generating a frequency control signal to the multi-phase controllable oscillator to reduce a frequency offset between the at least one reference clock signal and the clock signals provided by the multi-phase controllable oscillator.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a diagram illustrating a first injection scenario of an injection-locked phase rotator according to an embodiment of the present invention.

FIG. 9 is a diagram illustrating a second injection scenario of an injection-locked phase rotator according to an embodiment of the present invention.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
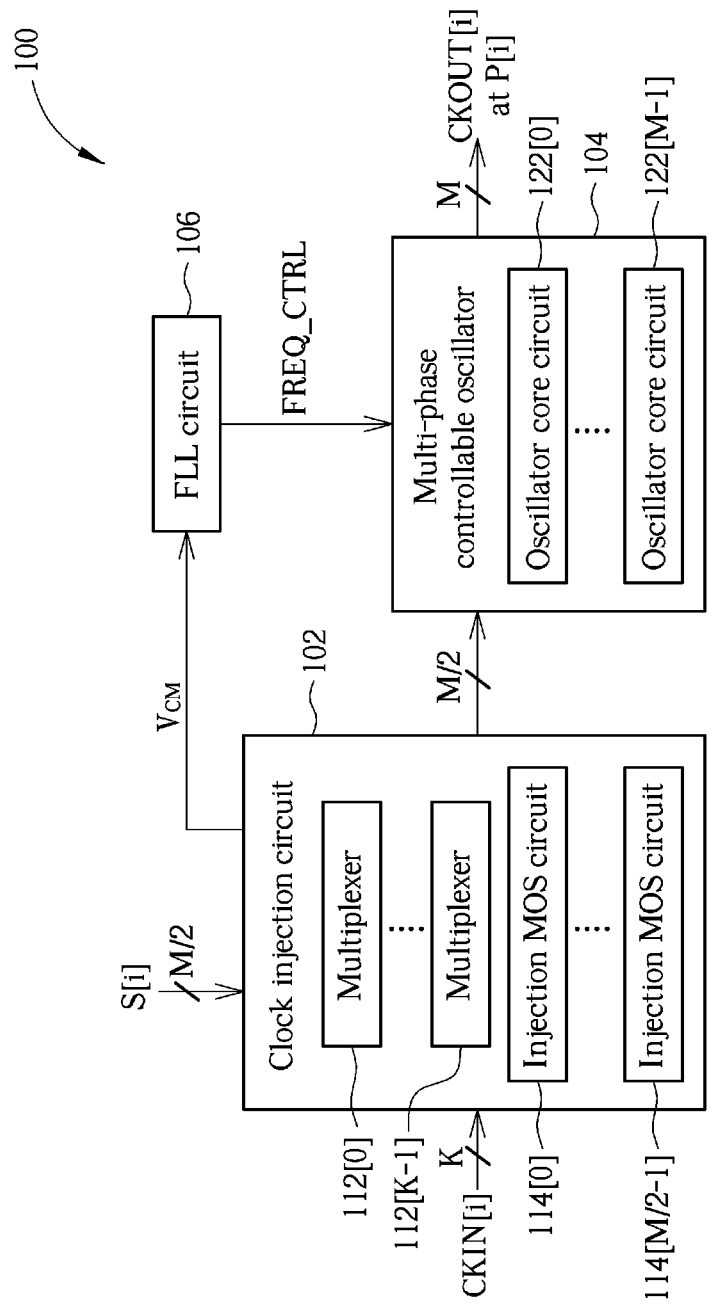
FIG. 1 is a block diagram illustrating an injection-locked phase rotator according to an embodiment of the present invention.
Figure 2:
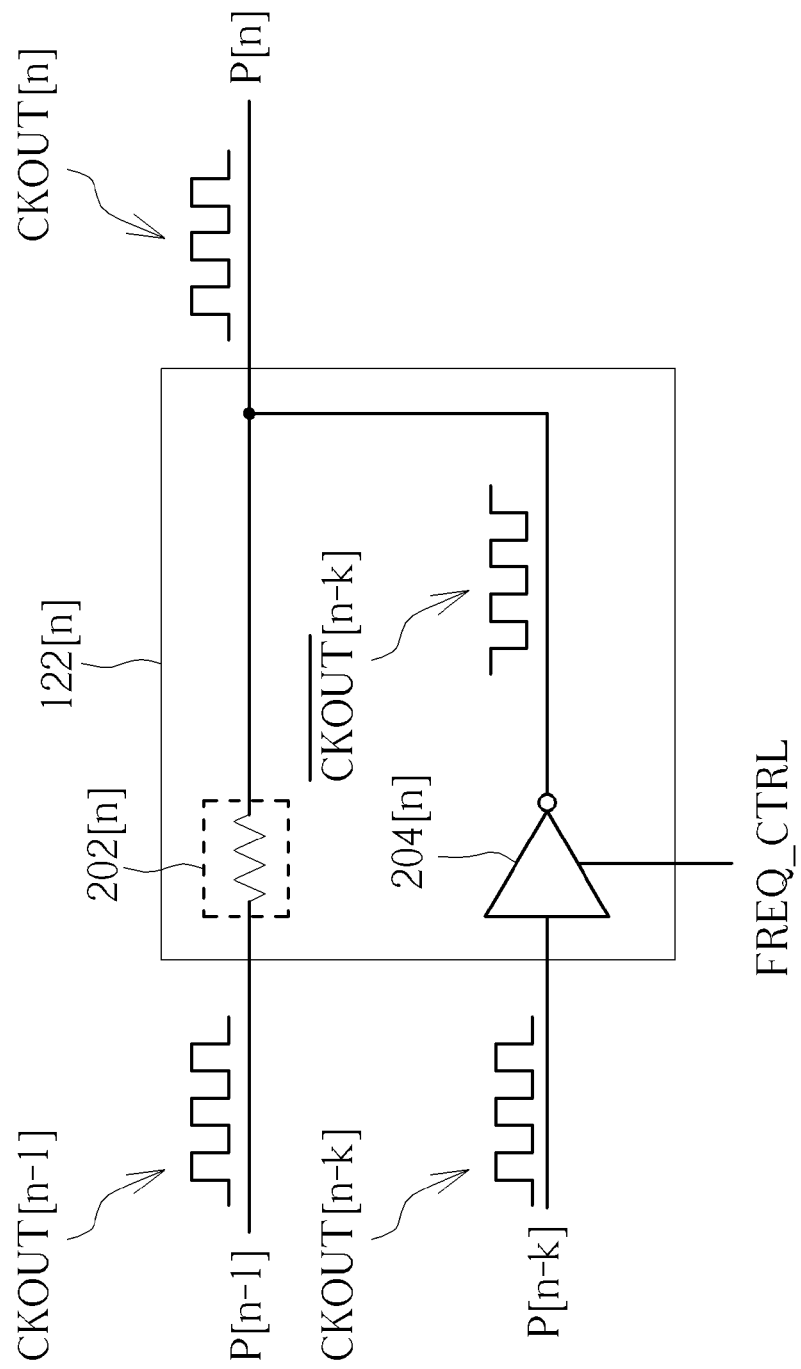
FIG. 2 is a diagram illustrating an oscillator core circuit according to an embodiment of the present invention.

FIG. 1 is a block diagram illustrating an injection-locked phase rotator according to an embodiment of the present invention. The injection-locked phase rotator 100 may be regarded as a clock generator which receives at least one reference clock signal CKIN[i] and generates output clock signals CKOUT[i] with different phases according to the at least one reference clock signal CKIN[i]. For example, the number of reference clock signals CKIN[i] may be K, where K is a positive integer equal to one or larger than one. As shown in FIG. 1, the injection-locked phase rotator 100 includes a clock injection circuit 102, a multi-phase controllable oscillator 104, and a frequency-locked loop (FLL) circuit 106. The multi-phase controllable oscillator 104 may be a multi-phase voltage-controlled oscillator (VCO) configured to provide a plurality of clock signals CKOUT[i] with a plurality of different phases at a plurality of phase nodes P[i], respectively. For example, the number of multi-phase clock signals CKOUT[i] provided by the multi-phase controllable oscillator 104 may be M, where M is an integer larger than one. At least a portion (i.e., part or all) of the multi-phase clock signals CKOUT[i] may be used by one or more application devices. In this embodiment, the multi-phase controllable oscillator 104 is configured to have M oscillator core circuits 122[0]-122[M−1]. FIG. 2 is a diagram illustrating an oscillator core circuit according to an embodiment of the present invention. The oscillator core circuit 122[n] may be any of the M oscillator core circuits 122[0]-122[M−1], where n is a positive integer selected from a range from 0 to (M−1). The oscillator core circuit 122[n] includes a resistive component 202[n] and an inverter 204[n]. The resistive component 202[n] is coupled between two phase nodes P[n−1] and P[n] of the multi-phase controllable oscillator 104, where clock signals CKOUT[n−1] and CKOUT [n] generated at the phase nodes P[n−1] and P[n] have adjacent phases of the multi-phase controllable oscillator 104. That is, the phase difference between phases of clock signals CKOUT[n−1] and CKOUT[n] is one phase step of the multi-phase controllable oscillator 104. By way of example, but not limitation, the resistive component 202[n] may be implemented using a metal resistor, a polysilicon resistor, or a metal oxide semiconductor (MOS) resistor.

Figure 3:
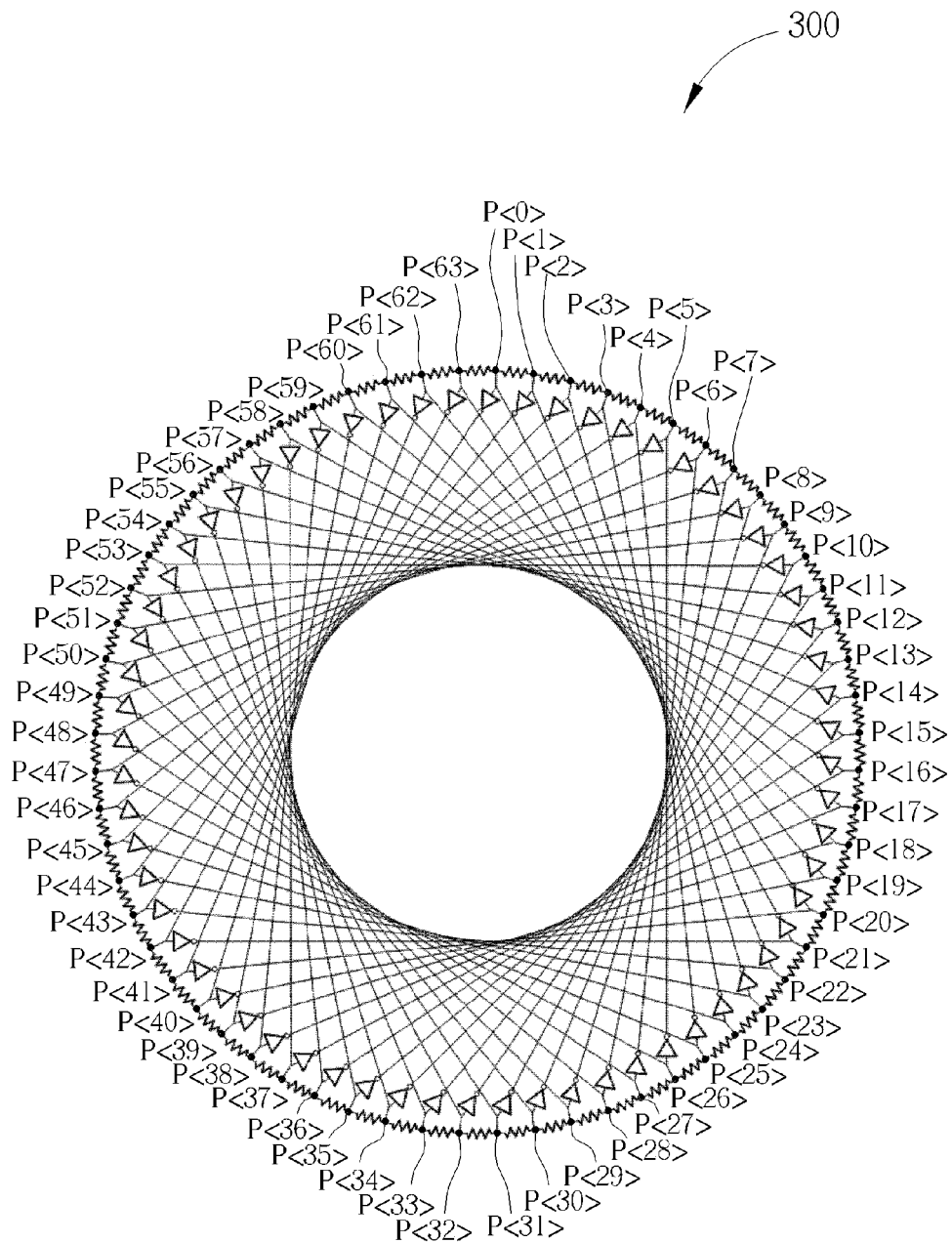
FIG. 3 is a diagram illustrating a multi-phase controllable oscillator according to an embodiment of the present invention.

In this embodiment, resistive components of the oscillator core circuits 122[0]-122[M−1] are cascaded in a ring configuration. Hence, when the phase node P[n−1] shown in FIG. 2 is the phase node P[0], the phase node P[n] shown in FIG. 2 is the phase node P[1], and when the phase node P[n−1] shown in FIG. 2 is the phase node P[M−1], the phase node P[n] shown in FIG. 2 is the phase node P[0]. The inverter 204[n] is configured to receive an input feedback clock signal CKOUT[n−k] from one phase node P[n−k] of the multi-phase controllable oscillator 104, and generate an output feedback clock signal $\overline{\text{CKOUT}}$[n−k] to the phase node P[n] according to the input feedback clock signal CKOUT[n−k], where k is a positive integer selected from a range from 1 to (M−1). The phase difference between clock signals CKOUT[n−k] and CKOUT[n] generated at the phase nodes P[n−k] and P[n] have k phase steps of the multi-phase controllable oscillator 104. For example, when k=2 and the phase node P[n] shown in FIG. 2 is the phase node P[2], the phase node P[n−k] shown in FIG. 2 is the phase node P[0], such that a clock signal generated at the phase node P[0] serves as the input feedback clock signal CKOUT[n−k] shown in FIG. 2. For another example, when k=2 and the phase node P[n] shown in FIG. 2 is the phase node P[1], the phase node P[n−k] shown in FIG. 2 is the phase node P[M−1], such that a clock signal generated at the phase node P[M−1] serves as the input feedback clock signal CKOUT [n−k] shown in FIG. 2. FIG. 3 is a diagram illustrating a multi-phase controllable oscillator according to an embodiment of the present invention. The multi-phase controllable oscillator 104 shown in FIG. 1 may be implemented using the multi-phase controllable oscillator 300 with M=64. However, this is for illustrative purposes only, and is not meant to be a limitation of the present invention.

The clock injection circuit 102 receives at least one reference clock signal generated from at least one clock source, where each reference clock signal CKIN[i] has a fixed phase. For example, the clock injection circuit 102 receives K reference clock signals CKIN[0]-CKIN[K−1], where K is a positive integer equal to one or larger than one, depending upon actual design considerations. In one exemplary design, the clock injection circuit 102 may receive a single reference clock signal CKIN[0], where K=1. In another exemplary design, the clock injection circuit 102 may receive a pair of differential reference clock signals CKIN[0] and CKIN[1], where K=2. In yet another exemplary design, the clock injection circuit 102 may receive a multi-phase reference clock input, including clock signals CKIN[0]-CKIN[K−1] with the same frequency but different phases, where K>2. In this embodiment, the center frequency Freq_inj of each reference clock signal CKIN[i] is twice the center frequency Freq_freerun of the clock signals CKOUT[i] provided at different phase nodes P[i] of the multi-phase controllable oscillator 104.

As for the clock injection circuit 102, it includes at least one multiplexer (e.g., K multiplexers 112[0]-112[K−1]) and a plurality of injection metal oxide semiconductor (MOS) circuits (e.g., M/2 injection MOS circuits 114[0]-114[M/2−1]). In this embodiment, each injection MOS circuit is coupled to two phase nodes of the multi-phase controllable oscillator 104. Hence, the number of the injection MOS circuits 114[0]-114[M/2−1] is half the number of clock phases provided by the multi-phase controllable oscillator 104.

Figure 4:
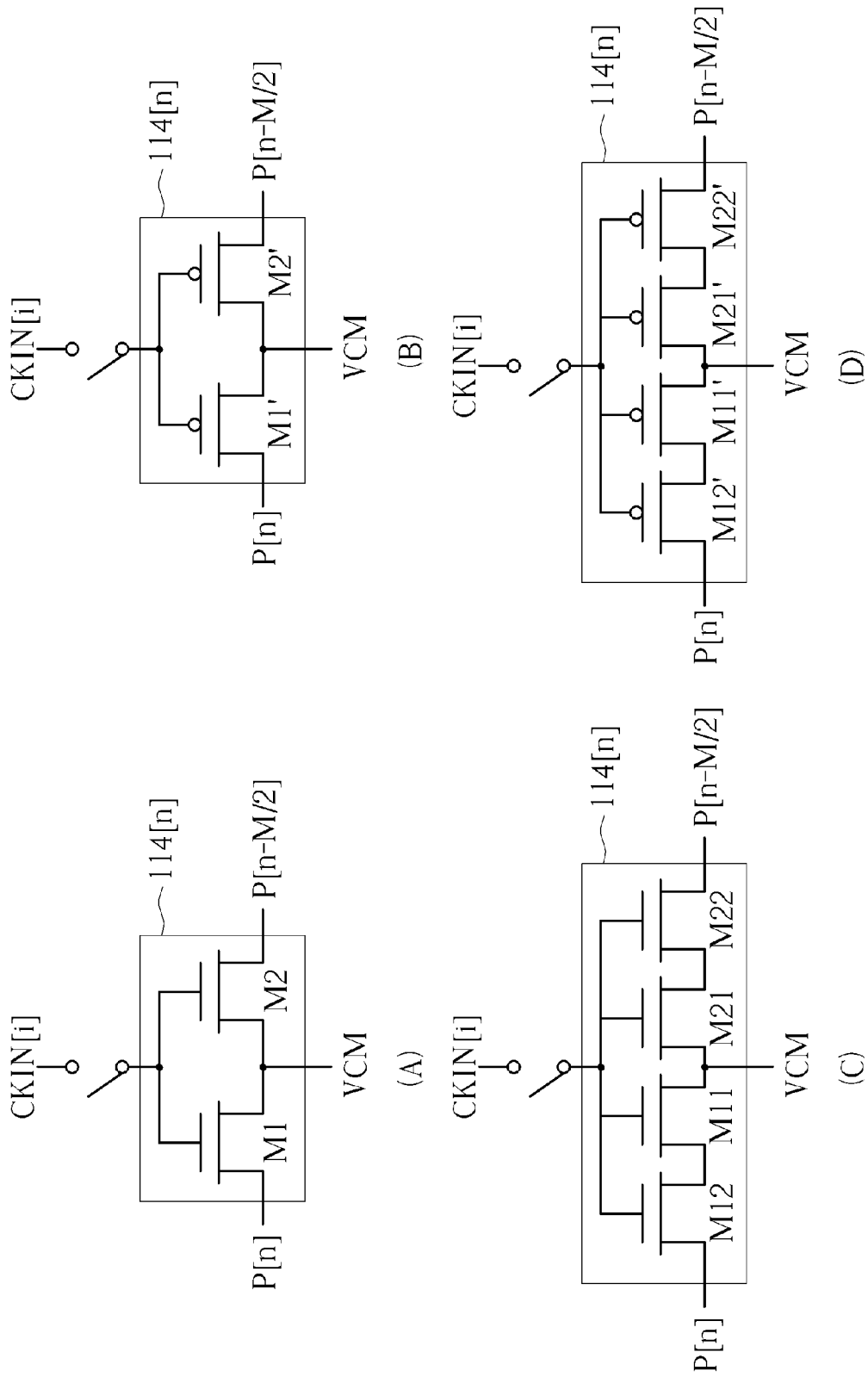
FIG. 4 is a diagram illustrating several exemplary designs of an injection MOS circuit.

FIG. 4 is a diagram illustrating several exemplary designs of an injection MOS circuit. The injection MOS circuit 114[n] may be used to realize any of the injection MOS circuits 114[0]-114[M/2−1] shown in FIG. 1. As shown in sub-diagram (A) of FIG. 4, the injection MOS circuit 114[n] includes one first MOS transistor M1 and one second MOS transistor M2, where each of the MOS transistors M1 and M2 is an N-channel MOS (NMOS) transistor. The injection MOS circuit 114[n] is coupled to two phase nodes P[n] and P[n−M/2] of the multi-phase controllable oscillator 104, where clock signals generated at the phase nodes P[n] and P[n−M/2] have a 180-degree phase difference. The first MOS transistor M1 has a control node, a first connection node coupled to the phase node P[n], and a second connection node coupled to a common-mode voltage node VCM of the clock injection circuit 102. The second MOS transistor M2 has a control node, a first connection coupled to the common-mode voltage node VCM of the clock injection circuit 102, and a second connection node coupled to the phase node P[n-M/2]. In a case where the reference clock signal CKIN[i] (which may represent a single reference clock signal received by the clock injection circuit 102, or may represent one of multiple reference clock signals received by the clock injection circuit 102) is selected and injected to the injection MOS circuit 114[n], the reference clock signal CKIN[i] is received by control nodes of the first MOS transistor M1 and the second MOS transistor M2.

Alternatively, the injection MOS circuit 114[n] may be modified to replace NMOS transistors M1 and M2 with P-channel MOS (PMOS) transistors M1' and M2', as shown in sub-diagram (B) of FIG. 4.

In some embodiments, the injection MOS circuit 114[n] may be implemented using more than one first MOS transistor and more than one second MOS transistor. As shown in sub-diagram (C) of FIG. 4, the injection MOS circuit 114[n] includes multiple first MOS transistors M11, M12 and multiple second MOS transistors M21, M22, where each of the MOS transistors M11, M12, M21 and M22 is an NMOS transistor. The first MOS transistor M11 has a control node, a first connection node coupled to the phase node P[n] via the first MOS transistor M12, and a second connection node coupled to a common-mode voltage node VCM of the clock injection circuit 102. The first MOS transistor M12 has a control node, a first connection node coupled to the phase node P[n], and a second connection node coupled to the common-mode voltage node VCM of the clock injection circuit 102 via the first MOS transistor M11. The second MOS transistor M21 has a control node, a first connection coupled to the common-mode voltage node VCM of the clock injection circuit 102, and a second connection node coupled to the phase node P[n-M/2] via the second MOS transistor M22. The second MOS transistor M22 has a control node, a first connection coupled to the common-mode voltage node VCM of the clock injection circuit 102 via the second MOS transistor M21, and a second connection node coupled to the phase node P[n-M/2]. In a case where the reference clock signal CKIN[i] (which may represent a single reference clock signal received by the clock injection circuit 102, or may represent one of multiple reference clock signals received by the clock injection circuit 102) is selected and injected to the injection MOS circuit 114[n], the reference clock signal CKIN[i] is received by control nodes of the first MOS transistors M11, M12 and the second MOS transistors M21, M22. Alternatively, the injection MOS circuit 114[n] may be modified to replace NMOS transistors M11, M12, M21 and M22 with PMOS transistors M11', M12', M21' and M22', as shown in sub-diagram (D) of FIG. 4.

It should be noted that these injection MOS circuit designs shown in FIG. 4 are for illustrative purposes only, and are not meant to be a limitation of the present invention. For example, any injection MOS circuit with common-mode voltage extraction capability can be used by the clock injection circuit 102.

Figure 5:
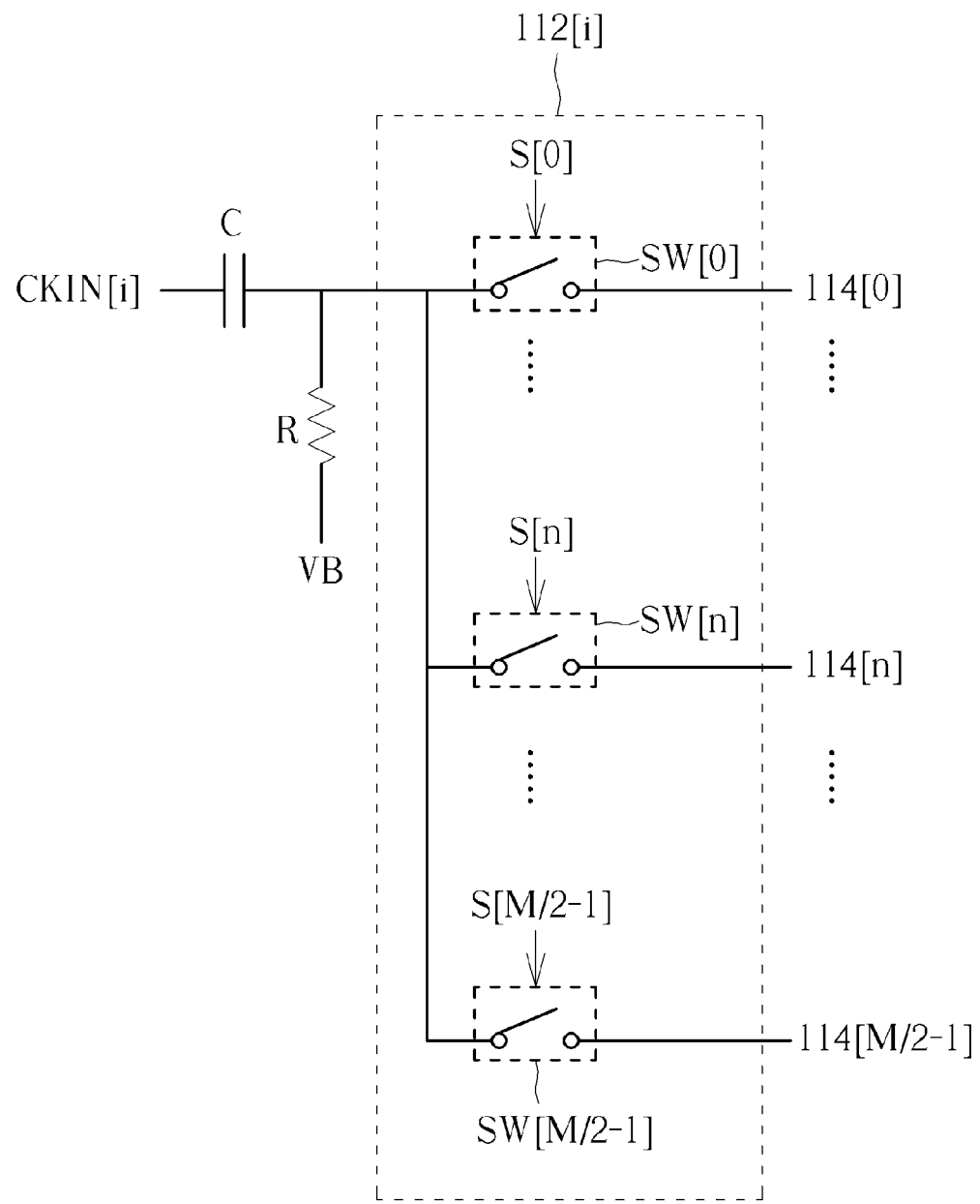
FIG. 5 is a diagram illustrating a multiplexer according to an embodiment of the present invention.

The clock injection circuit 102 further includes multiplexers 112[0]-112[K−1] used to control transmission of reference clock signals CKIN[0]-CKIN[K−1]. The number of multiplexers 112[0]-112[K−1] depends on the number of reference clock signals CKIN[0]-CKIN[K−1]. For example, when the clock injection circuit 102 is used to receive a single reference clock signal, the clock injection circuit 102 is configured to have a single multiplexer. For another example, when the clock injection circuit 102 is used to receive a pair of differential reference clock signals, the clock injection circuit 102 is configured to have two multiplexers. In this embodiment, one multiplexer is configured to receive one reference clock signal, and is controlled to transmit the reference clock signal to one or more injection MOS circuits. That is, the multiplexer serves as a phase selector for transmitting the incoming reference clock signal to selected injection MOS circuit(s) for clock injection at selected phases of the multi-phase controllable oscillator 104. FIG. 5 is a diagram illustrating a multiplexer according to an embodiment of the present invention. The multiplexer 112[i] may be any of the multiplexers 112[0]-112[K−1] shown in FIG. 1. The multiplexer 112[i] includes a plurality of switches SW[0]-SW[M/2−1] coupled to the injection MOS circuits 114[0]-114[M/2−1], where the switches SW[0]-SW[M/2−1] are controlled by switch control signals S[0]-S[M/2−1], respectively. In one exemplary design, each of the switches SW[0]-SW[M/2−1] may be implemented using a transmission gate. In another exemplary design, each of the switches SW[0]-SW[M/2−1] may be implemented using a tri-state buffer.

As shown in FIG. 5, the reference clock signal CKIN[i] passes through an AC-coupled buffer (which may be implemented using a capacitor C), and is level-shifted by a bias voltage VB transmitted via a resistor R. If the reference clock signal CKIN[i] is needed to be supplied to an injection MOS circuit 114[n], a switch control signal S[n] may be set by "1" to turn on an associated switch SW[n], where n may be a positive integer selected from a range from 0 to (M/2−1). In a case where the reference clock signal CKIN[i] is needed to be supplied to only one injection MOS circuit, only one selected switch is turned on, while the rest of the switches SW[0]-SW[M/2−1] are turned off. In another case where the reference clock signal CKIN[i] is needed to be supplied to multiple injection MOS circuits, only multiple selected switches are turned on, while the rest of the switches SW[0]-SW[M/2−1] are turned off.

Figure 6:
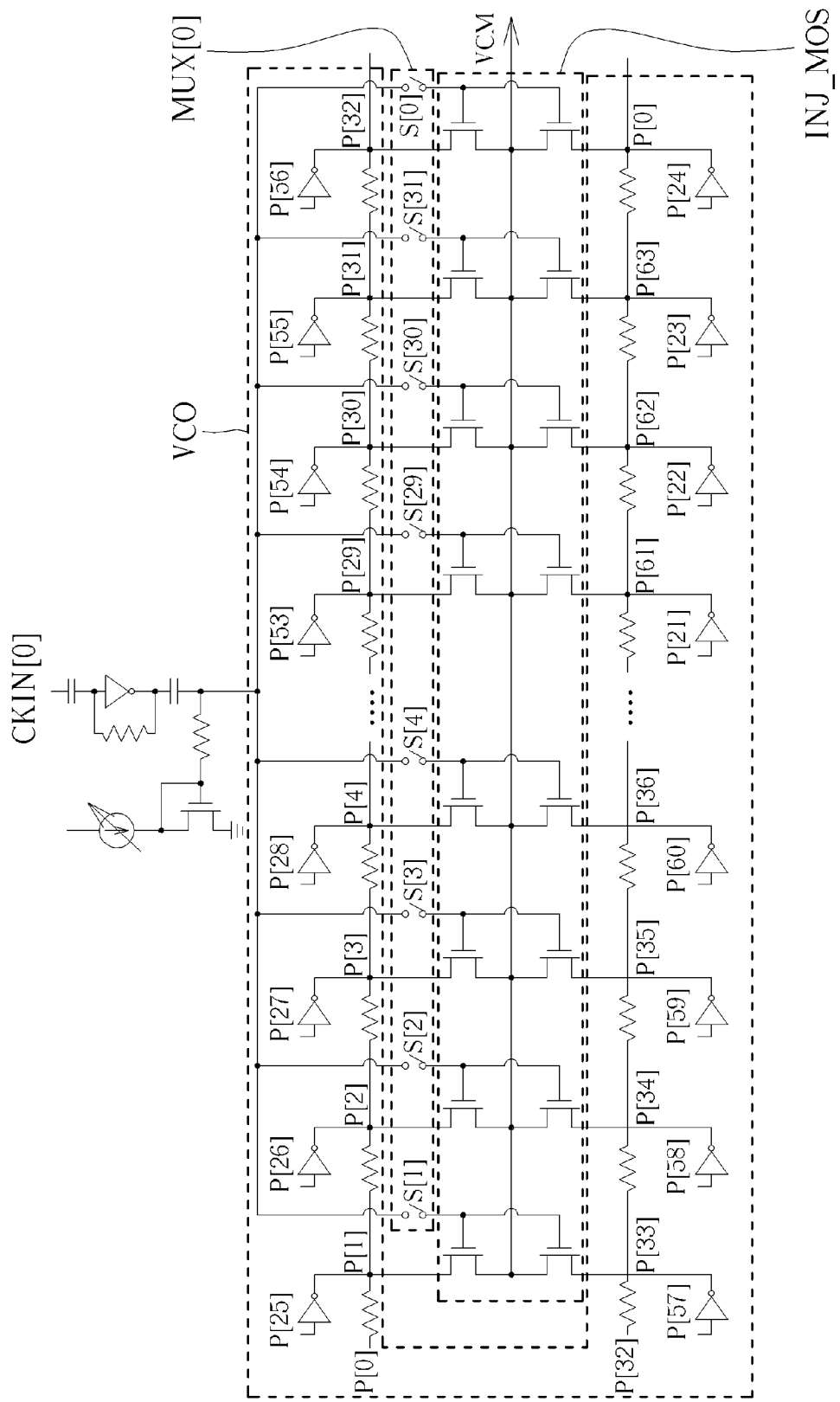
FIG. 6 is a diagram illustrating a first circuit design of a clock injection circuit and a multi-phase controllable oscillator according to an embodiment of the present invention.

FIG. 6 is a diagram illustrating a first circuit design of a clock injection circuit and a multi-phase controllable oscillator according to an embodiment of the present invention. In this embodiment, M=64 and K=1. Hence, a single reference clock signal CKIN[0] with a fixed frequency is generated from a clock source to a clock injection circuit that is configured to have a single multiplexer (which is denoted by MUX[0]) and 64 injection MOS circuits (which are collectively denoted by INJ_MOS). By way of example, the multiplexer MUX[0] may be implemented using the exemplary multiplexer design shown in FIG. 5, and/or each injection MOS circuit may be implemented using the exemplary injection MOS circuit design shown in FIG. 4. Further, the multi-phase controllable oscillator (which is denoted by VCO) is used to provide 64 clock signals at 64 phase nodes P[0]-P[63]. By way of example, each oscillator core circuit in the multi-phase controllable oscillator VCO may be implemented using the exemplary oscillator core circuit design shown in FIG. 2, and/or the multi-phase controllable oscillator may have the exemplary configuration shown in FIG. 3.

Figure 7:
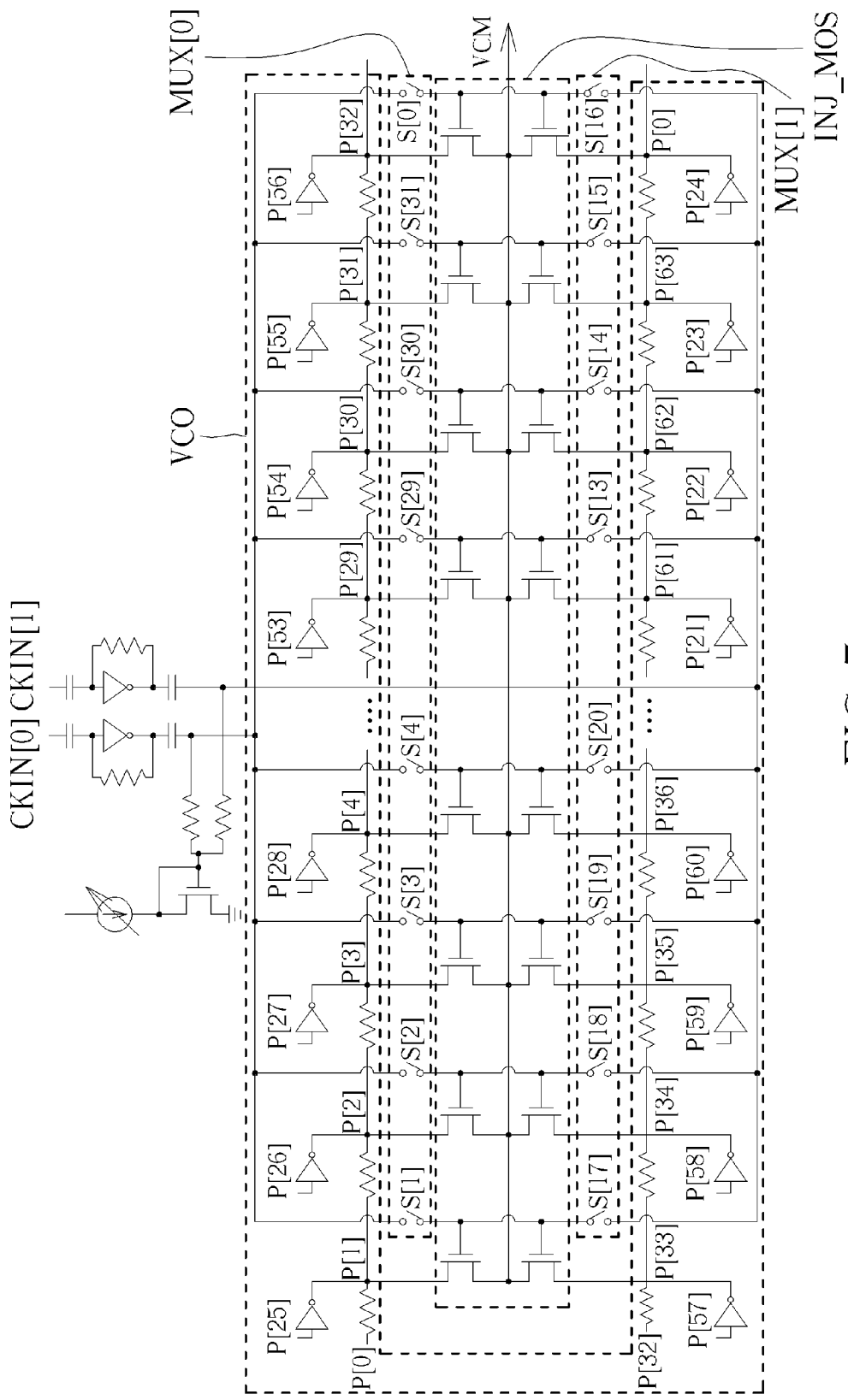
FIG. 7 is a diagram illustrating a second circuit design of a clock injection circuit and a multi-phase controllable oscillator according to an embodiment of the present invention.

In an alternative design, the number of reference clock signals may be larger than one. FIG. 7 is a diagram illustrating a second circuit design of a clock injection circuit and a multi-phase controllable oscillator according to an embodiment of the present invention. In this embodiment, M=64 and K=2. For example, two reference clock signals CKIN[0] and CKIN[1] may form a pair of differential clock signals with a 180-degree phase difference therebetween, and one or both of the reference clock signals CKIN[0] and CKIN[1] may be injected into the multi-phase controllable oscillator for setting the phase rotation. The number of multiplexers implemented in the clock injection circuit is equal to the number of reference clock signals. Hence, the reference clock signals CKIN[0] and CKIN[1] are received by a clock injection circuit having two multiplexers (which are denoted by MUX[0] and MUX[1]) and 64 injection MOS circuits (which are collectively denoted by INJ_MOS). The multiplexer MUX[0] is used to transmit the reference clock signal CKIN[0] to one or more of the injection MOS circuits, and the multiplexer MUX[1] is used to transmit the other reference clock signal CKIN[1] to one or more of the injection MOS circuits. By way of example, each multiplexer may be implemented using the exemplary multiplexer design shown in FIG. 5, and/or each injection MOS circuit may be implemented using the exemplary injection MOS circuit design shown in FIG. 4. Further, the multi-phase controllable oscillator (which is denoted by VCO) is used to provide 64 clock signals at 64 phase nodes P[0]-P[63]. By way of example, each oscillator core circuit in the multi-phase controllable oscillator may be implemented using the exemplary oscillator core circuit design shown in FIG. 2, and/or the multi-phase controllable oscillator VCO may have the exemplary configuration shown in FIG. 3.

In summary, the number of multiplexers implemented in the clock injection circuit depends on the number of reference clock signals. If the number of reference clock signals is K, the clock injection circuit is configured to have K multiplexers, where each multiplexer has a plurality of switches each coupled to one injection MOS circuit. Hence, an injection MOS circuit has K candidate injection clock inputs, and receives an injection clock input when one switch coupled between the injection MOS circuit and the injection clock input is turned on.

By controlling injection of at least one reference clock signals (e.g., CKIN[0] and CKIN[1]), phases of clock signals generated at different phase nodes of the multi-phase controllable oscillator can be properly rotated. FIG. 8 is a diagram illustrating a first injection scenario of an injection-locked phase rotator according to an embodiment of the present invention. Suppose that an injection-locked phase rotator with two reference clock signals CKIN[0] and CKIN[1] has 32 phase nodes P[0]-P[31] at which 32 clock signals with different phases but the same frequency are generated respectively. For example, the circuit design shown in FIG. 7 may be modified to have 32 phase nodes P[0]-P[31] only and have 16 switch control signals S[0]-S[15] only, and the injection-locked phase rotator may be realized by such a modified circuit design. In the first injection scenario, the switch control signal S[0] is set to have a logic high level "1", and each of other switch control signals S[1]-S[15] is set to have a logic low level "0". Hence, only a switch controlled by the switch control signal S[0] is turned on to transmit the reference clock signal CKIN[0] to an injection MOS circuit that is connected to an output port of the turned-on switch and also connected to two phase nodes P[0] and P[16] of the multi-phase controllable oscillator. In other words, only the reference clock signal CKIN[0] is injected to the multi-phase controllable oscillator. As shown in FIG. 8, clocks generated at phase nodes P[0] and P[16] have a 180-degree phase difference, and the time when clocks at phase nodes P[0] and P[16] have zero-crossing is aligned with the time when the injected reference clock signal CKIN[0] has the maximum magnitude. In accordance with the design of the multi-phase controllable oscillator, clocks generated at phase nodes P[0] and P[8] have a 90-degree phase difference, and clocks generated at phase nodes P[16] and P[24] have a 90-degree phase difference. Since the center frequency of each of the reference clock signals CKIN[0] and CKIN[1] is twice the center frequency of a clock signal provided at each of the phase nodes P[0]-P[31] of the multi-phase controllable oscillator, the time when clocks at phase nodes P[8] and P[24] have zero-crossing is aligned with the time when the reference clock signal CKIN[1] has the maximum magnitude.

When the injection point of the reference clock signal CKIN[0] is adjusted, phases of clock signals generated at phase nodes P[0]-P[31] are rotated correspondingly. FIG. 9 is a diagram illustrating a second injection scenario of an injection-locked phase rotator according to an embodiment of the present invention. In the second injection scenario, the switch control signal S[1] is set to have a logic high level "1", and each of other switch control signals S[0] and S[2]-S[15] is set to have a logic low level "0". Hence, only a switch controlled by the switch control signal S[1] is turned on to transmit the reference clock signal CKIN[0] to an injection MOS circuit that is connected to an output port of the turned-on switch and also connected to two phase nodes P[1] and P[17] of the multi-phase controllable oscillator. As shown in FIG. 9, clocks generated at phase nodes P[1] and P[17] have a 180-degree phase difference, and the time when clocks at phase nodes P[1] and P[17] have zero-crossing is aligned with the time when the injected reference clock signal CKIN[0] has the maximum magnitude. In accordance with the design of the multi-phase controllable oscillator, clocks generated at phase nodes P[1] and P[9] have a 90-degree phase difference, and clocks generated at phase nodes P[17] and P[25] have a 90-degree phase difference. Since the center frequency of each of the reference clock signals CKIN[0] and CKIN[1] is twice the center frequency of a clock signal provided at each of the phase nodes P[0]-P[31] of the multi-phase controllable oscillator, the time when clocks at phase nodes P[9] and P[25] have zero-crossing is aligned with the time when the reference clock signal CKIN[1] has the maximum magnitude. Due to phase rotation made by the adjusted clock injection, the phase of the clock generated at the phase node P[0] under the first injection scenario shown in FIG. 8 is different from the phase of the clock generated at the phase node P[0] under the second injection scenario shown in FIG. 9, and is identical to the phase of the clock generated at the phase node P[1] under the second injection scenario shown in FIG. 9.

Figure 10:
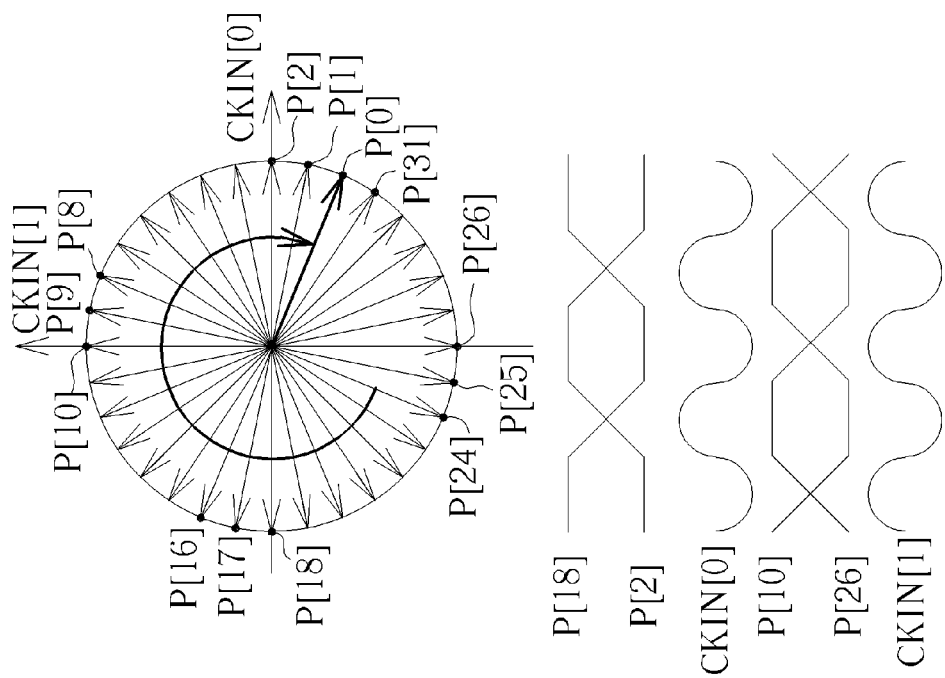
FIG. 10 is a diagram illustrating a third injection scenario of an injection-locked phase rotator according to an embodiment of the present invention.

FIG. 10 is a diagram illustrating a third injection scenario of an injection-locked phase rotator according to an embodiment of the present invention. In the third injection scenario, the switch control signal S[2] is set to have a logic high level "1", and each of the other switch control signals S[0]-S[1] and S[3]-S[15] is set to have a logic low level "0". Hence, only a switch controlled by the switch control signal S[2] is turned on to transmit the reference clock signal CKIN[0] to an injection MOS circuit that is connected to an output port of the turned-on switch and also connected to two phase nodes P[2] and P[18] of the multi-phase controllable oscillator. As shown in FIG. 10, clocks generated at phase nodes P[2] and P[18] have a 180-degree phase difference, and the time when clocks at phase nodes P[2] and P[18] have zero-crossing is aligned with the time when the injected reference clock signal CKIN[0] has the maximum magnitude. In accordance with the design of the multi-phase controllable oscillator, clocks generated at phase nodes P[2] and P[10] have a 90-degree phase difference, and clocks generated at phase nodes P[18] and P[26] have a 90-degree phase difference. Since the center frequency of each of the reference clock signals CKIN[0] and CKIN[1] is twice the center frequency of a clock signal provided at each of the phase nodes P[0]-P[31] of the multi-phase controllable oscillator, the time when clocks at phase nodes P[10] and P[26] have zero-crossing is aligned with the time when the reference clock signal CKIN[1] has the maximum magnitude. Due to phase rotation made by the adjusted clock injection, the phase of the clock generated at the phase node P[0] under the first injection scenario shown in FIG. 8 is different from the phase of the clock generated at the phase node P[0] under the third injection scenario shown in FIG. 10, and is identical to the phase of the clock generated at the phase node P[2] under the third injection scenario shown in FIG. 10.

As can be seen from examples shown in FIGS. 8-10, clock phases at the phase nodes of the multi-phase controllable oscillator can be rotated by changing injection point (s) of reference clock signal (s). Ideally, the center frequency Freq_inj of each reference clock signal CKIN[i] received by the clock injection circuit 102 is twice the center frequency Freq_freerun of a clock signal CKOUT[i] provided at each phase node P[i] of the multi-phase controllable oscillator 104, where Freq_inj/2 is equal to Freq_freerun. However, due to certain factors, it is possible that there is a frequency offset Freq_offset between the at least one reference clock signal CKIN[i] and the clock signals CKOUT[i] provided by the multi-phase controllable oscillator 104, where Freq_offset=Freq_inj/2-Freq_freerun. The present invention proposes using injection MOS circuits with the common-mode voltage extraction capability, such that the extracted common-mode voltage $V_{CM}$ can be referenced by the FLL circuit 106 to adjust the multi-phase controllable oscillator 104 for frequency offset reduction.

Figure 11:
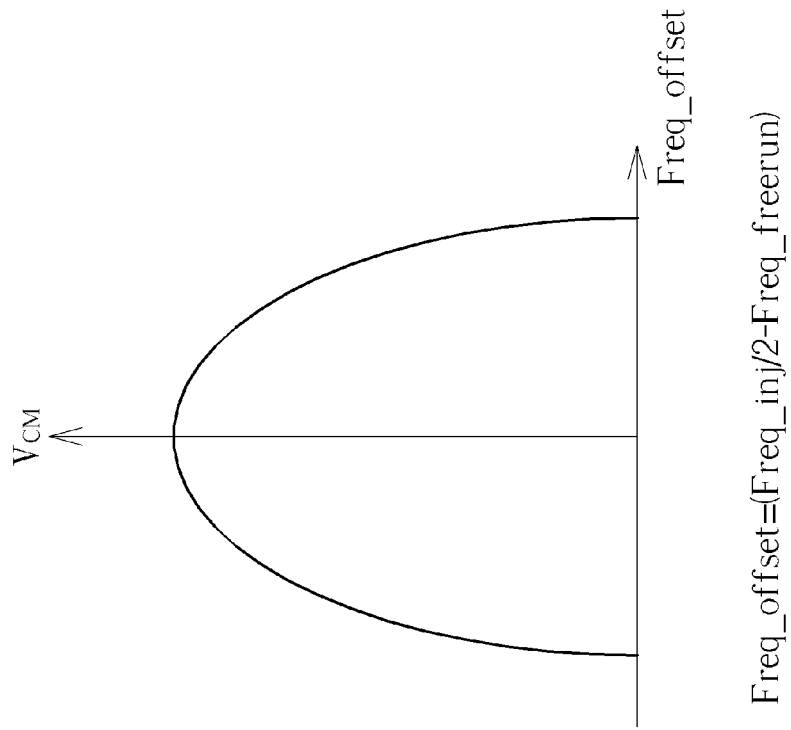
FIG. 11 is a diagram illustrating a relation between a frequency offset and a common-mode voltage according to an embodiment of the present invention.

FIG. 11 is a diagram illustrating a relation between a frequency offset and a common-mode voltage according to an embodiment of the present invention. As shown in FIG. 11, the common-mode voltage $V_{CM}$ at the common-mode voltage node of the clock injection circuit 102 has a largest voltage level when the frequency offset Freq_offset has a zero offset value. When the frequency offset Freq_offset is a negative offset value and gradually increases toward the zero offset value, the common-mode voltage $V_{CM}$ at the common-mode voltage node of the clock injection circuit 102 gradually increases toward the largest voltage level. When the frequency offset Freq_offset is a positive offset value and gradually decreases toward the zero offset value, the common-mode voltage $V_{CM}$ at the common-mode voltage node of the clock injection circuit 102 gradually increases toward the largest voltage level. Hence, the frequency offset Freq_offset can be estimated according to a slope value associated with the common mode voltage $V_{CM}$ (i.e., a change rate of the common mode voltage $V_{CM}$). Based on such observation, the FLL circuit 106 can be configured to monitor the common-mode voltage $V_{CM}$ to adaptively adjust the frequency control signal FREQ_CTRL of the multi-phase controllable oscillator 104. For example, the frequency control signal FREQ_CTRL may be a bias current supplied to the inverter 204 of each oscillator core circuit 122[n] shown in FIG. 2. For another example, the frequency control signal FREQ_CTRL may be a bias voltage supplied to the inverter 204 of each oscillator core circuit 122[n] shown in FIG. 2.

Figure 12:
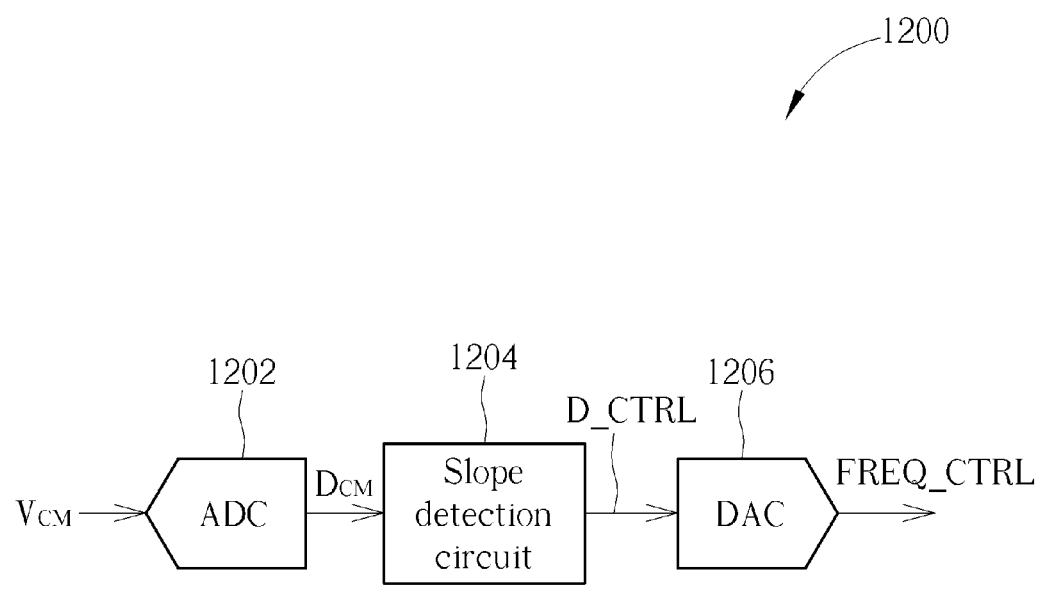
FIG. 12 is a diagram illustrating an FLL circuit according to an embodiment of the present invention.

FIG. 12 is a diagram illustrating an FLL circuit according to an embodiment of the present invention. The FLL circuit 106 shown in FIG. 1 may be implemented using the FLL circuit 1200 shown in FIG. 12. The FLL circuit 1200 includes an analog-to-digital converter (ADC) 1202, a slope detection circuit 1204, and a digital-to-analog converter (DAC) 1206. The ADC 1202 is configured to perform analog-to-digital conversion according to a sampling clock, and sample the common-mode voltage $V_{CM}$ to generate one sampled common-mode voltage value $D_{CM}$ per sampling period. In one exemplary design, the slope detection circuit 1204 may be implemented using a digital signal processor running a common-mode voltage slope detection algorithm. The slope detection circuit 1204 is configured to analyze the sampled common-mode voltage value $D_{CM}$ to detect a slope value associated with the common-mode voltage $V_{CM}$, and determine a frequency control value D_CTRL according to the slope value. For example, the slope detection circuit 1204 may refer to the sampled common-mode voltage value $D_{CM}$ obtained by a previous sampling operation and the sampled common-mode voltage value $D_{CM}$ obtained by a current sampling operation to estimate the slope value. The DAC is configured to perform digital-to-analog conversion upon the frequency control value D_CTRL to thereby convert the frequency control value D_CTRL into the frequency control signal FREQ_CTRL, where the frequency control signal FREQ_CTRL may be a bias current or a bias voltage of the multi-phase controllable oscillator 104, depending upon actual design considerations.

The configuration of the injection-locked phase rotator 100 shown in FIG. 1 is only one embodiment of the present invention. Any clock generator using one or more technical features possessed by the proposed injection-locked phase rotator 100 falls within the scope of the present invention. For example, a clock generator may employ the proposed multi-phase controllable oscillator that uses resistive components to generate sub-gate delays. For another example, a clock generator may employ a clock injection circuit that uses injection MOS circuits with common-mode voltage extraction capability and an FLL circuit that refers to the extracted common-mode voltage to set a frequency control signal of a multi-phase controllable oscillator for frequency offset reduction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator comprising:
a multi-phase controllable oscillator, having a plurality of phase nodes at which a plurality of clock signals with a plurality of different phases are generated, respectively, the multi-phase controllable oscillator comprising:
a plurality of oscillator core circuits, each comprising:
a resistive component, coupled between a first phase node and a second phase node of the multi-phase controllable oscillator, wherein clock signals generated at the first phase node and the second phase node have adjacent phases of the multi-phase controllable oscillator; and
an inverter, configured to receive an input feedback clock signal from one phase node of the multi-phase controllable oscillator, and generate an output feedback clock signal to the second phase node according to the input feedback clock signal;
wherein resistive components of the oscillator core circuits are cascaded in a ring configuration.

2. The clock generator of claim 1, further comprising:
a clock injection circuit, configured to receive at least one reference clock signal and inject the at least one reference clock signal to the multi-phase controllable oscillator.

3. The clock generator of claim 2, further comprising:
a frequency-locked loop (FLL) circuit, configured to monitor a common-mode voltage at a common-mode voltage node of the clock injection circuit and generate a frequency control signal to the oscillator core circuits to reduce a frequency offset between the at least one reference clock signal and the clock signals provided by the multi-phase controllable oscillator.

4. The clock generator of claim 3, wherein the FLL circuit comprises:
an analog-to-digital converter (ADC), configured to sample the common-mode voltage to generate a sampled common-mode voltage value;
a slope detection circuit, configured to analyze the sampled common-mode voltage value to detect a slope value associated with the common-mode voltage, and determine a frequency control value according to the slope value; and
a digital-to-analog converter (DAC), configured to convert the frequency control value into the frequency control signal.

5. The clock generator of claim 3, wherein the clock injection circuit comprises:
a plurality of injection metal oxide semiconductor (MOS) circuits, each coupled to a third phase node and a fourth phase node of the multi-phase controllable oscillator, wherein the common-mode voltage is shared by the injection MOS circuits, clock signals generated at the third phase node and the fourth phase node have a 180-degree phase difference, and the at least one reference clock signal is injected to the multi-phase controllable oscillator through at least one injection MOS circuit.

6. The clock generator of claim 5, wherein each of the injection MOS circuits comprises:
at least one first MOS transistor, having a control node, a first connection node coupled to the third phase node, and a second connection node coupled to the common-mode voltage node; and
at least one second MOS transistor, having a control node, a first connection node coupled to the common-mode voltage node, and a second connection node coupled to the fourth phase node;
wherein when the at least one reference clock signal is injected to the injection MOS circuit, the at least one reference clock signal is received by control nodes of the at least one first MOS transistor and the at least one second MOS transistor.

7. The clock generator of claim 2, wherein the clock injection circuit comprises:
a plurality of injection metal oxide semiconductor (MOS) circuits, each coupled to a third phase node and a fourth phase node of the multi-phase controllable oscillator, wherein clock signals generated at the third phase node and the fourth phase node have a 180-degree phase difference; and
at least one multiplexer, comprising a plurality of switches coupled to the injection MOS circuits, respectively, wherein the at least one multiplexer is configured to receive the at least one reference clock signal, and transmit the at least one reference clock signal to at least one injection MOS circuit.

8. A clock generator comprising:
a multi-phase controllable oscillator, having a plurality of phase nodes at which a plurality of clock signals with a plurality of different phases are generated, respectively;
a clock injection circuit, configured to receive at least one reference clock signal and inject the at least one reference clock signal to the multi-phase controllable oscillator; and
a frequency-locked loop (FLL) circuit, configured to monitor a common-mode voltage at a common-mode voltage node of the clock injection circuit and generate a frequency control signal to the multi-phase controllable oscillator to reduce a frequency offset between the at least one reference clock signal and the clock signals provided by the multi-phase controllable oscillator.

9. The clock generator of claim 8, wherein the FLL circuit comprises:
an analog-to-digital converter (ADC), configured to sample the common-mode voltage to generate a sampled common-mode voltage value;
a slope detection circuit, configured to analyze the sampled common-mode voltage value to detect a slope value associated with the common-mode voltage, and determine a frequency control value according to the slope value; and
a digital-to-analog converter (DAC), configured to convert the frequency control value into the frequency control signal.

10. The clock generator of claim 8, wherein the clock injection circuit comprises:
a plurality of injection metal oxide semiconductor (MOS) circuits, each coupled to a first phase node and a second phase node of the multi-phase controllable oscillator, wherein the common-mode voltage is shared by the injection MOS circuits, clock signals generated at the first phase node and the second phase node have a 180-degree phase difference, and the at least one reference clock signal is injected to the multi-phase controllable oscillator through at least one injection MOS circuit.

11. The clock generator of claim 10, wherein each of the injection MOS circuits comprises:
at least one first MOS transistor, having a control node, a first connection node coupled to the first phase node, and a second connection node coupled to the common-mode voltage node; and at least one second MOS transistor, having a control node, a first connection coupled to the common-mode voltage node, and a second connection node coupled to the second phase node;

wherein when the at least one reference clock signal is injected to the injection MOS circuit, the at least one reference clock signal is received by control nodes of the at least one first MOS transistor and the at least one second MOS transistor.

12. A clock generation method comprising:
configuring a multi-phase controllable oscillator to have a plurality of oscillator core circuits, each comprising:
  a resistive component, coupled between a first phase node and a second phase node of the multi-phase controllable oscillator, wherein clock signals generated at the first phase node and the second phase node have adjacent phases of the multi-phase controllable oscillator; and
  an inverter, configured to receive an input feedback clock signal from one phase node of the multi-phase controllable oscillator, and generate an output feedback clock signal to the second phase node according to the input feedback clock signal; and
utilizing the multi-phase controllable oscillator to provide a plurality of clock signals with a plurality of different phases at a plurality of phase nodes, respectively;
wherein resistive components of the oscillator core circuits are cascaded in a ring configuration.

13. The clock generation method of claim 12, further comprising:
utilizing a clock injection circuit for receiving at least one reference clock signal and injecting the at least one reference clock signal to the multi-phase controllable oscillator.

14. The clock generation method of claim 13, further comprising:
monitoring a common-mode voltage at a common-mode voltage node of the clock injection circuit; and
generating a frequency control signal to the oscillator core circuits to reduce a frequency offset between the at least one reference clock signal and the clock signals provided by the multi-phase controllable oscillator.

15. The clock generation method of claim 14, wherein monitoring the common-mode voltage comprises:
performing analog-to-digital conversion to sample the common-mode voltage to generate a sampled common-mode voltage value; and
analyzing the sampled common-mode voltage value to detect a slope value associated with the common-mode voltage, and determining a frequency control value according to the slope value; and
generating the frequency control signal comprises:
performing digital-to-analog conversion to convert the frequency control value into the frequency control signal.

16. The clock generation method of claim 14, wherein injecting the at least one reference clock signal to the multi-phase controllable oscillator comprises:
configuring the clock injection circuit to have a plurality of injection metal oxide semiconductor (MOS) circuits, each coupled to a third phase node and a fourth phase node of the multi-phase controllable oscillator, wherein the common-mode voltage is shared by the injection MOS circuits, and clock signals generated at the third phase node and the fourth phase node have a 180-degree phase difference; and injecting the at least one reference clock signal to the multi-phase controllable oscillator through at least one injection MOS circuit.

17. The clock generation method of claim 16, wherein each of the injection MOS circuit comprises:
at least one first MOS transistor, having a control node, a first connection node coupled to the third phase node, and a second connection node coupled to the common-mode voltage; and
at least one second MOS transistor, having a control node, a first connection coupled to the common-mode voltage, and a second connection node coupled to the fourth phase node;
wherein when the at least one reference clock signal is injected to the injection MOS circuit, the at least one reference clock signal is received by control nodes of the at least one first MOS transistor and the at least one second MOS transistor.

18. The clock generation method of claim 13, wherein injecting the at least one reference clock signal to the multi-phase controllable oscillator comprises:
utilizing a plurality of injection metal oxide semiconductor (MOS) circuits, each coupled to a third phase node and a fourth phase node of the multi-phase controllable oscillator, wherein clock signals generated at the third phase node and the fourth phase node have a 180-degree phase difference; and
controlling a plurality of switches coupled to the injection MOS circuits respectively to transmit the at least one reference clock signal to at least one injection MOS circuit.

19. A clock generation method comprising:
utilizing a multi-phase controllable oscillator to provide a plurality of clock signals with a plurality of different phases at a plurality of phase nodes, respectively;
utilizing a clock injection circuit for receiving at least one reference clock signal and injecting the at least one reference clock signal to the multi-phase controllable oscillator; and
monitoring a common-mode voltage at a common-mode voltage node of the clock injection circuit, and generating a frequency control signal to the multi-phase controllable oscillator to reduce a frequency offset between the at least one reference clock signal and the clock signals provided by the multi-phase controllable oscillator.

20. The clock generation method of claim 19, wherein monitoring the common-mode voltage comprises:
performing analog-to-digital conversion to sample the common-mode voltage to generate a sampled common-mode voltage value; and
analyzing the sampled common-mode voltage value to detect a slope value associated with the common-mode voltage, and determining a frequency control value according to the slope value; and
generating the frequency control signal to the multi-phase controllable oscillator comprises:
performing digital-to-analog conversion to convert the frequency control value into the frequency control signal.

21. The clock generation method of claim 19, wherein injecting the at least one reference clock signal to the multi-phase controllable oscillator comprises:
configuring the clock injection circuit to have a plurality of injection metal oxide semiconductor (MOS) circuits, each coupled to a first phase node and a second phase node of the multi-phase controllable oscillator, wherein the common-mode voltage is shared by the injection MOS circuits, and clock signals generated at the first phase node and the second phase node have a 180-degree phase difference; and injecting the at least one reference clock signal to the multi-phase controllable oscillator through at least one injection MOS circuit.

22. The clock generation method of claim 21, wherein each of the injection MOS circuit comprises:

at least one first MOS transistor, having a control node, a first connection node coupled to the first phase node, and a second connection node coupled to the common-mode voltage node; and at least one second MOS transistor, having a control node, a first connection coupled to the common-mode voltage node, and a second connection node coupled to the second phase node;

wherein when the at least one reference clock signal is injected to the injection MOS circuit, the at least one reference clock signal is received by control nodes of the at least one first MOS transistor and the at least one second MOS transistor.

\* \* \* \* \*